(12) United States Patent
Sheen et al.

(10) Patent No.: US 7,888,208 B2
(45) Date of Patent: Feb. 15, 2011

(54) METHOD OF FABRICATING NON-VOLATILE MEMORY DEVICE

(75) Inventors: Dong Sun Sheen, Yongin-si (KR); Seok Pyo Song, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 296 days.

(21) Appl. No.: 12/164,879

(22) Filed: Jun. 30, 2008

(65) Prior Publication Data

US 2009/0170283 A1    Jul. 2, 2009

(30) Foreign Application Priority Data

Dec. 28, 2007    (KR) ...................... 10-2007-0141027

(51) Int. Cl.
*H01L 21/336*    (2006.01)
(52) U.S. Cl. ...................................... 438/264; 438/259
(58) Field of Classification Search .................. 438/264
See application file for complete search history.

(56) References Cited

U.S. PATENT DOCUMENTS

| | | | |
|---|---|---|---|
| 6,222,225 B1 * | 4/2001 | Nakamura et al. | 257/315 |
| 6,228,727 B1 * | 5/2001 | Lim et al. | 438/296 |
| 7,084,031 B2 | 8/2006 | Lee | |
| 7,211,484 B2 | 5/2007 | Lee et al. | |
| 7,601,588 B2 * | 10/2009 | Choi et al. | 438/257 |
| 2003/0119257 A1 * | 6/2003 | Dong et al. | 438/257 |
| 2004/0102005 A1 * | 5/2004 | Dong et al. | 438/257 |
| 2006/0246666 A1 * | 11/2006 | Han et al. | 438/263 |
| 2007/0128797 A1 * | 6/2007 | Cho | 438/257 |
| 2008/0003739 A1 * | 1/2008 | Lee et al. | 438/221 |
| 2008/0081411 A1 * | 4/2008 | Cho et al. | 438/257 |

OTHER PUBLICATIONS

Aoki, T. "Porous Silicon Oxynitride Films Derived from Polysilazane as a Novel Low-Dielectric Constant Material" Mat. Res. Soc. Symp. Proc. vol. 565, 1999 pp. 41-46.*

* cited by examiner

*Primary Examiner*—N Drew Richards
*Assistant Examiner*—Grant S Withers
(74) *Attorney, Agent, or Firm*—Marshall, Gerstein & Borun LLP

(57) ABSTRACT

A method of fabricating a non-volatile memory device, A tunnel insulating layer, a floating gate, and a pad nitride layer is formed on a semiconductor substrate. A isolation region of the semiconductor substrate is formed by etching to a predetermined depth, and a liner insulating layer is formed on an entire surface of the resulting trench for device isolation. A filling insulation layer is formed on the liner insulating layer to fill the trench and a first etching process is performed on the filling insulation layer and the liner insulating layer. The surface of semiconductor is recessed by performing a second etching process on the filling insulation layer. A capping layer is formed on an entire surface of the result formed by the second etching process. The device isolation layer of a concave shape is formed by performing an etching process on the capping layer.

20 Claims, 5 Drawing Sheets

US 7,888,208 B2

METHOD OF FABRICATING NON-VOLATILE MEMORY DEVICE

CROSS-REFERENCE TO RELATED APPLICATION

Priority to Korean patent application number 10-2007-0141027, filed on Dec. 28, 2007, the disclosure of which is incorporated by reference in its entirety, is claimed.

BACKGROUND OF THE INVENTION

The invention relates to a method of fabricating a semiconductor device and, more particularly, to a method of fabricating a non-volatile memory device.

When a non-volatile memory device, e.g., a flash memory device, has a minimum line width of less than approximately 100 nm, interference phenomena between mutually adjacent unit cells become more problematic. During data program, erase, and read operations, interference phenomena of flash memory devices frequently. Interference phenomena between floating gates (FGs) and between a control gate (CG) and a channel on a substrate make up a large percentage of various interference phenomena of such semiconductor devices. Due to these interference phenomena, there are limitations to improvements in the degree of integration for an ultrafine flash memory device.

To overcome these limitations, a method of fabricating a trench device isolation layer has attracted much interest; this method takes advantage of a self aligned-shallow trench isolation (SA-STI) technique. Moreover, to enhance filling characteristics, a method of using a spin on dielectric (SOD) layer as a trench filling insulation layer is being noted with great interest. According to the SA-STI technique, after forming a tunnel oxide layer on a substrate in order to expose a device isolation region of the substrate and also a pattern of a floating gate electrode layer, the exposed portion of the substrate is etched in order to allow a trench for device isolation to be aligned on the floating gate electrode pattern. Next, the trench is filled with the filling insulation layer to form a trench device isolation layer.

Although an SA-STI structure may be useful in increasing the degree of integration of a device, interference phenomena still occur. For example, when forming a device isolation layer through the SA-STI technique, the following limitations may arise. If the effective field height (EFH) of a formed device isolation layer is too high, interference phenomena occur between adjacent floating gate electrodes. If the EFH of the device isolation layer is too low, interference phenomena also arise because an interval between a control gate electrode and a channel region in a semiconductor substrate becomes closer. On the other hand, when the SOD layer is used as a trench filling insulation layer, it is advantageous for filling the narrowed inside of a trench. However, the surface of a SOD insulating layer may be exposed during subsequent processes. In this case, due to vulnerable wet etching characteristics of the SOD layer, loss of the exposed SOD layer during the subsequent processes may occur. Consequently, reliability of a device can be deteriorated.

SUMMARY OF THE INVENTION

The invention is directed to a method of fabricating a non-volatile memory device.

In one embodiment, a method of fabricating a non-volatile memory device includes: sequentially forming a tunnel insulating layer, a floating gate, and a pad nitride layer on a semiconductor substrate; forming an opening to expose a device isolation region of the semiconductor substrate by patterning the pad nitride layer, the floating gate, and the tunnel insulating layer; forming a trench for device isolation by etching the exposed portion of the semiconductor substrate to a predetermined depth; forming a liner insulating layer on an entire surface of the resulting trench for device isolation; forming a filling insulation layer on the liner insulating layer to fill the trench; performing a first etching process on the filling insulation layer and the liner insulating layer to allow top surfaces of the filling insulation layer and the liner insulating layer to be disposed higher than a bottom surface of the patterned floating gate; performing a second etching process on the filling insulation layer and the liner insulating layer to allow the top surface of the filling insulation layer to be disposed below the surface of the semiconductor substrate and the top surface of the liner insulating layer to be disposed above the surface of the semiconductor substrate; filling the trench on the filling insulation layer to form a first capping layer and a second capping layer, the first capping layer being disposed parallel to the tunnel insulating layer and recessed to have a concave shape, the second capping layer being disposed on the liner insulating layer to contact a bottom side of the floating gate; forming a gate insulating layer on the first capping layer, the second capping layer, and the floating gate; and forming a control gate on the gate insulating layer.

DESCRIPTION OF SPECIFIC EMBODIMENTS

Hereinafter, a method of fabricating a non-volatile memory device in accordance with the invention is described in detail with reference to the accompanying drawings.

Figure 1:
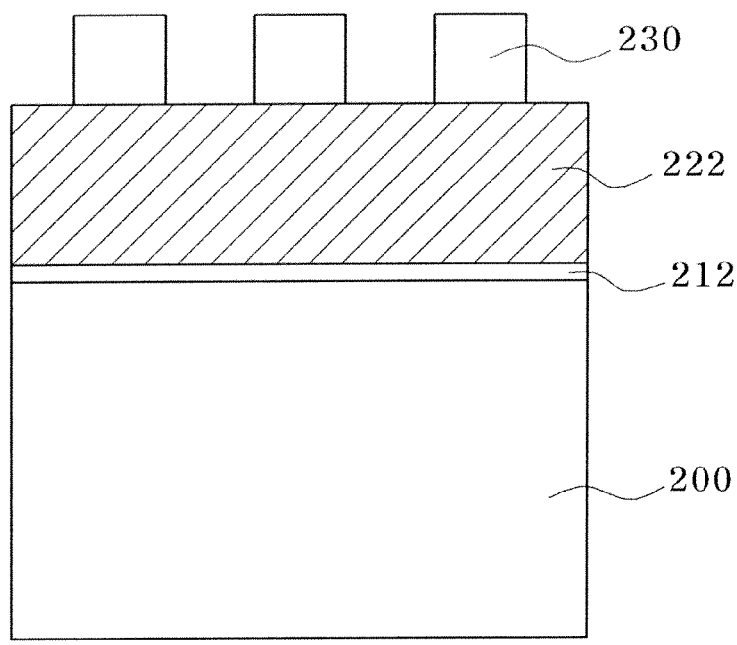
FIGS. 1 to 9 illustrate a method of fabricating a non-volatile memory device according to the invention.

Referring to FIG. 1, a tunnel insulating layer 212 and an electrode layer 222 for a floating gate are sequentially stacked on a semiconductor substrate 200. A pad nitride pattern 230 as a hard mask is formed on the electrode layer 222 for a floating gate. The tunnel insulating layer 212 preferably comprises an oxide layer or a high-k dielectric layer, and the electrode layer 222 for a floating gate preferably comprises a doped polysilicon layer.

Figure 2:
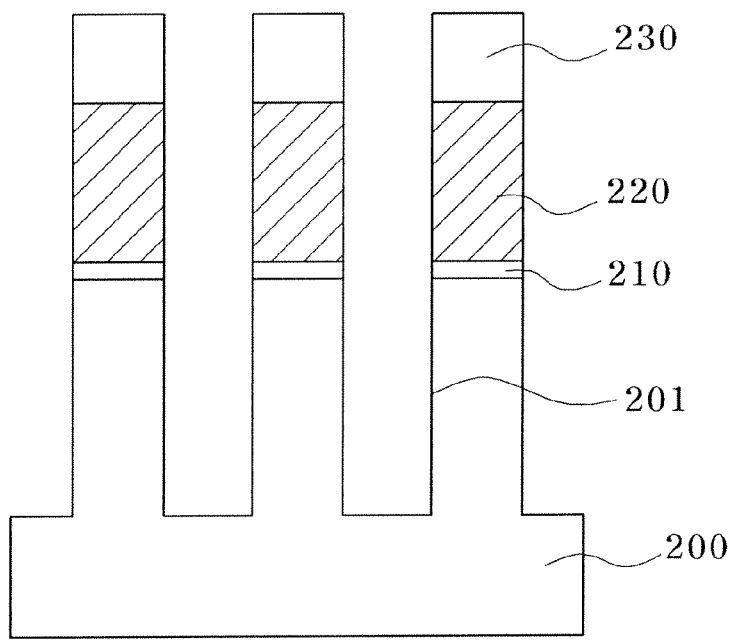

Referring to FIG. 2, by using the pad nitride pattern 230 as an etching mask, the exposed portions of the electrode layer 222 of FIG. 1 for a floating gate and the tunnel insulating layer 212 of FIG. 1 are sequentially etched. A tunnel insulating pattern 210 and an electrode pattern 220 for a floating gate are formed to expose a device isolation region of the semiconductor substrate 200 through this etching process. Then, the device isolation region of the semiconductor substrate 200 is etched at a predetermined depth to form a trench 201.

Figure 3:
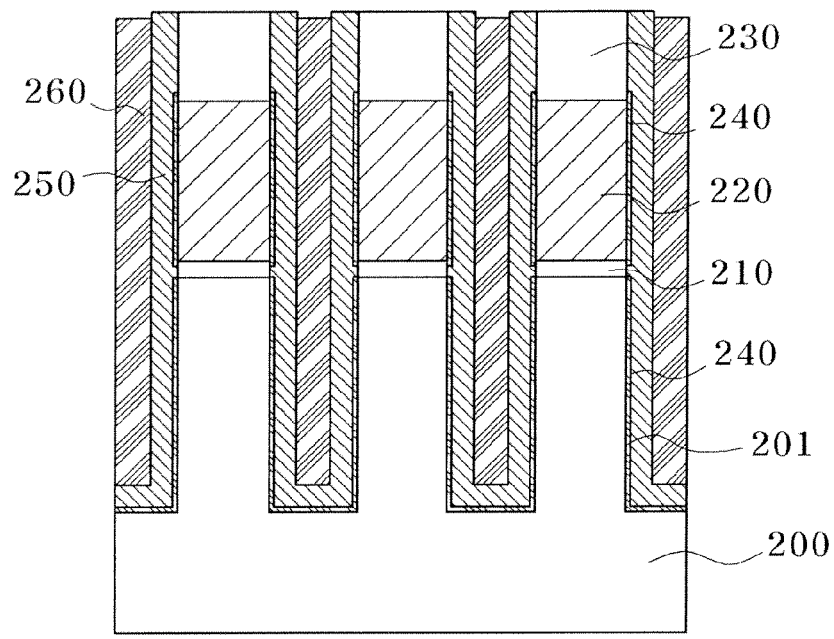

Referring to FIG. 3, a sidewall oxide layer 240 is formed with a predetermined thickness, preferably by performing a thermal oxidation process on the inner wall of the trench 201. When the electrode layer 222 for a floating gate comprises a polysilicon layer, the sidewall oxide layer 240 is formed on a sidewall of the pad nitride pattern 230. Next, a liner insulating layer 250 is formed on the sidewall oxide layer 240, the pad nitride pattern 230, and the tunnel insulating pattern 210. The liner insulating layer 250 is preferably formed using a chemical vapor deposition (CVD) method, an atomic layer deposition (ALD) method, or an $O_3$-ozone-tetra-ethyl-ortho-silicate (TEOS) method. At this point, a silicon source preferably comprises silane (SiH$_4$), dichlorosilane (SiCl$_2$H$_2$), disilane (Si$_2$H$_6$) or TEOS. An oxygen source preferably comprises O$_2$, O$_3$, or N$_2$O, Next, a spin on dielectric (SOD) layer 260 is coated on the resultant structure having the liner insulating layer 250 to fill the trench 201. The SOD layer 260 is preferably formed using per-hydropoly-silazane, hydro-silsesquioxane, or silicate. After forming the SOD layer 260, the remaining solvent in the SOD layer 260 is removed, preferably through a baking process. Additionally, the SOD layer 260 itself becomes densified through a thermal treatment process. The baking process for the SOD layer 260 is preferably performed on a hot plate or in an oven, preferably at a temperature between approximately 50° C. and approximately 350° C. The thermal treatment process for the SOD layer 260 is preferably performed at a temperature between approximately 300° C. and approximately 750° C., preferably under one atmosphere of a gas selected from the group consisting of H$_2$, O$_2$, H$_2$O, N$_2$, and combinations thereof. Next, a planarization process, e.g., chemical mechanical polishing (CMP), is performed on the densified SOD layer to expose the top surface of the pad nitride pattern 230.

Figure 4:
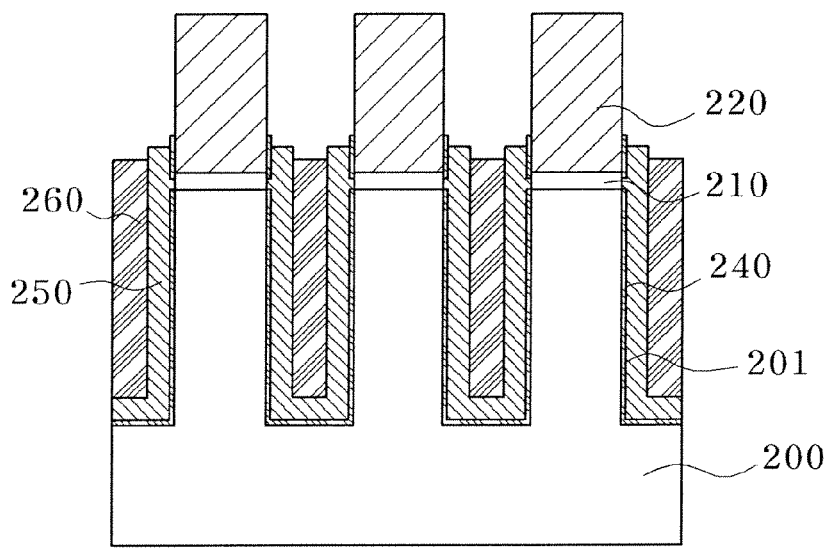

Referring to FIG. 4, a wet etching process, preferably using a phosphoric acid solution (H$_3$PO$_4$+H$_2$O) is performed to remove the pad nitride pattern 230 of FIG. 3. Next, although the sidewall oxide layer 240, the liner insulating layer 250, and the SOD layer 260 are partially removed through a dry etching process, the remaining top surface of the SOD insulating layer 260 is formed to be disposed higher than the bottom surface of the electrode pattern 220 for a gate. This dry etching process is preferably performed using a vapor gas mixed with HF and NH$_4$F or plasma. When the liner insulating layer 250 includes an oxide layer, there is almost no etching selectivity between the sidewall oxide layer 240, the liner insulating layer 250, and the SOD layer 260 during the dry etching process, and results of the above layers 240, 250, and 260 have the almost same thickness.

Figure 5:
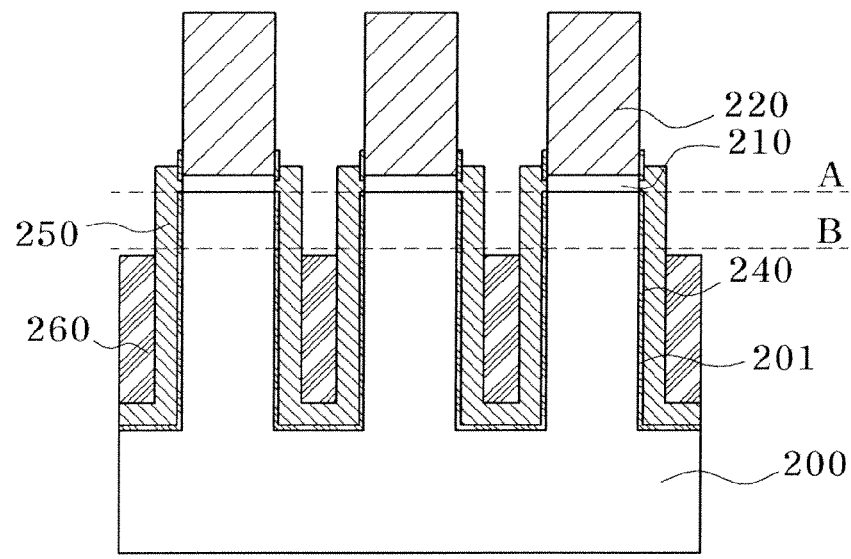

Referring to FIG. 5, after the drying etching process, a wet etching process is performed on the sidewall oxide layer 240, the liner insulating layer 250, and the SOD layer 260. This wet etching process is preferably performed using a HF solution diluted with NH$_4$F or H$_2$O as an etchant. The SOD layer 260 has a different etch rate than other oxide layer during a wet etching process unlike a dry etching process. That is, during a wet etching process, the SOD layer 260 has a relatively higher etch rate than the liner insulating layer 250 including an oxide layer. Accordingly, after the wet etching process, the remaining top surface of the SOD layer 260 is disposed lower than the top surface of the liner insulating layer 250. Especially, the top surface of the SOD layer 260 is disposed below a dotted horizontal line B in FIG. 5, which is etched during a subsequent process, e.g., a cell contact hole process. Accordingly, the SOD layer 260 is not affected by an etching process for forming a subsequent cell contact hole. For example, in order to prevent the SOD layer 260 from being affected by an etching process for a subsequent cell contact cell, the SOD layer 260 is removed through the wet etching process to be below a dotted line A of the semiconductor substrate 200, preferably by a thickness between approximately 400 Å and approximately 2000 Å.

Figure 6:
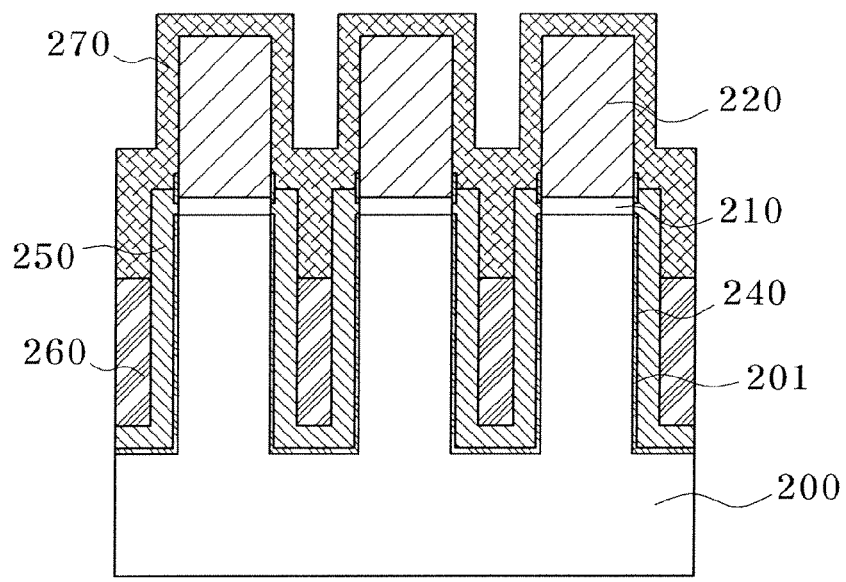

Referring to FIG. 6, a capping layer 270 is formed to fill an empty space in the trench formed when a portion of the SOD layer 26 is removed during the dry etching process, and to surround the electrode pattern 220 for a floating gate. The capping layer 270 is preferably formed using CVD, ALD, or O$_3$-TEOS. For one example, the capping layer 270 includes a silicon-based oxide layer. In this case, a silicon source for the capping layer 270 preferably comprises silane (SiH$_4$), dichlorosilane (SiCl$_2$H$_2$), disilane (Si$_2$H$_6$) or TEOS. An oxygen source preferably comprises O$_2$, O$_3$, or N$_2$O.

Figure 7:
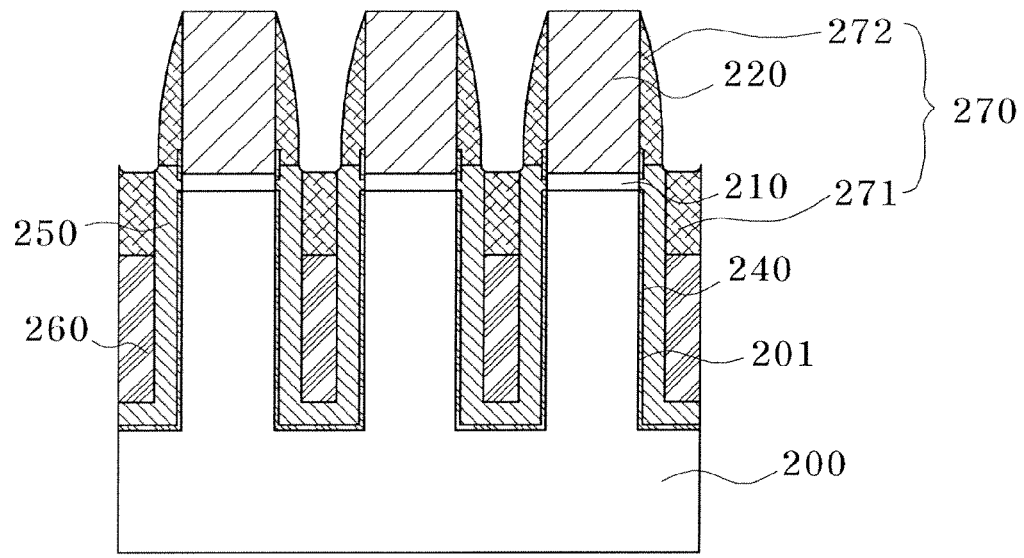

Referring to FIG. 7, a dry etching process is performed on the capping layer 270. This dry etching process is performed until the top surface of the electrode pattern 220 for a floating gate is exposed. The capping layer 270 is divided into a first capping layer 271 and a second capping layer 272 through a dry etching process. The first capping layer 270 fills the trench and is disposed on the SOD layer 260, and the second capping layer 272 is disposed on the side of the electrode pattern 220 for a floating gate in a spacer form. In this embodiment, the top surface of the first capping layer 271 is approximately disposed parallel to the tunnel insulating layer 210 through the dry etching process. Additionally, the edge of the liner insulating layer 250 can be exposed during the dry etching process, and this case can partially remove the exposed portions.

Figure 8:
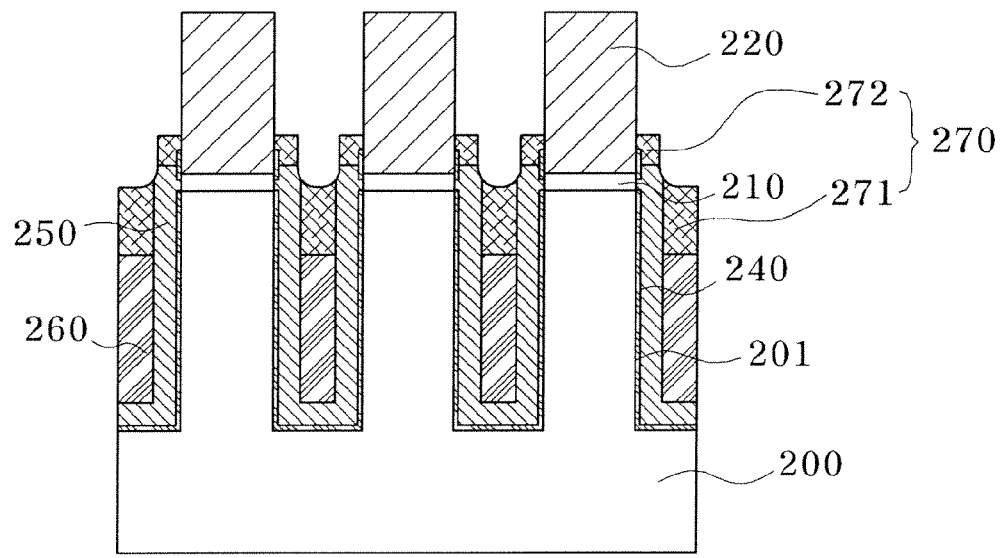

Referring to FIG. 8, a wet etching process, preferably using a HF solution diluted with NH$_4$F or H$_2$O or a dry etching process, preferably using a vapor gas mixed with HF and NH$_4$F or plasma is performed on the first and second capping layers 271 and 272. By using this etching process, the top surface of the first capping layer 271 is recessed in a concave shape. Additionally, because the top portion of the second capping layer 272 is removed, only the lower portion of the second capping layer 272 remains. Especially, the lowest surface of the recessed portion of the first capping layer 271, i.e., the middle portion of the structure, is disposed above the surface of the semiconductor substrate 200, preferably by approximately 300 Å. During the etching process for the first capping layer 271 and the second capping layer 272, an edge portion of the liner insulating layer 250 may be exposed. In this case, the exposed edge portion of the liner insulating layer 250 may be etched to have a concave shape. The concave recessed first capping layer 271 serves as a device isolation layer of the SA-STI structure in addition to the SOD layer 260. Accordingly, the top surface of the first capping layer 271 becomes the EFH of the SA-STI structure. Therefore, like this embodiment, the top portion of the first capping layer 271, which constitutes the SA-STI structure together with the SOD layer 260, is recessed to have a concave shape, and to be disposed parallel to the tunnel insulating layer 201. Interference phenomenon between adjacent floating gates due to the higher EFH of the SA-STI structure can be prevented.

Figure 9:
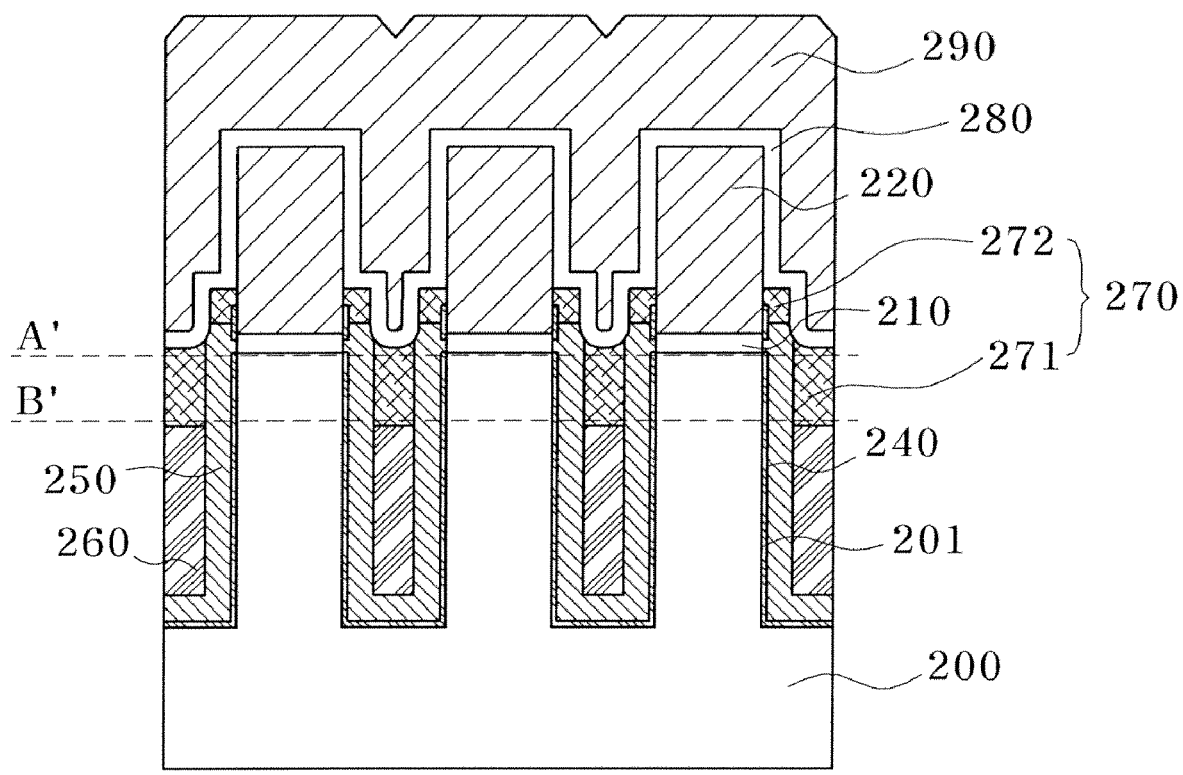

Referring to FIG. 9, a dielectric layer 280 is formed on the entire surface. The dielectric layer 280 is preferably formed using a member selected from the group consisting of SiO$_2$, SixNy, Al$_2$O$_3$, ZrO$_2$, HfSiO$_2$, HFAlO$_2$, and combinations thereof. A control gate 290 is formed on the dielectric layer 280. The control gate 290 is preferably formed using a member selected from the group consisting of polysilicon, WSix, WN, W, TiN, TaN, CoSix, NiSix, TaCN, and combinations thereof. In FIG. 9, a line A' represents the EFH of a device isolating layer that can be exposed by an etching process for patterning a subsequent control gate. A line B' represents the EFH of a device isolating layer that can be exposed by an etching process for forming a subsequent cell contact hole such as a source/drain contact hole. As illustrated in the drawings, because the first capping layer 271 is disposed on the SOD insulating layer 260, the SOD insulating layer 260 is not exposed during a subsequent process in any cases. Additionally, because the second capping layer 272 is disposed on the liner insulating layer 250, and the concave first capping layer 271 is disposed on the top side of the liner insulating layer 250, interval between the control gate 290 and the channel region of the semiconductor substrate 200 can be adequately maintained. Therefore, interference phenomena between the control gate 290 and the channel region can be prevented also.

While the invention has been described with respect to the specific embodiments, various changes and modifications may be made without departing from the spirit and scope of the invention as defined in the following claims.

What is claimed is:

1. A method of fabricating a non-volatile memory device, the method comprising:
   forming a tunnel insulating layer, a floating gate, and a pad nitride layer on a semiconductor substrate;
   forming a trench for device isolation by etching a device isolation region of the semiconductor substrate to a predetermined depth;
   forming a liner insulating layer on a resulting surface of the semiconducter substrate including the trench;
   filling the trench with an insulation layer on the liner insulating layer to form an isolation layer;
   performing a first etching process on the isolation layer and the liner insulating layer;
   recessing the isolation layer and the liner insulating layer by a second etching process, wherein the top surface of the recessed isolation layer is disposed below the surface of the semiconductor substrate;
   forming a capping layer on a surface of the result formed by the second etching process including the recessed isolation layer and liner insulating layer; and
   forming a first capping layer at a surface of the isolation layer and a second capping layer at both sidewalls of the floating gate by performing a third etching process on the capping layer.

2. The method of claim 1, further comprising forming a gate insulating layer on the resulting surface including the isolation layer having a concave shape; and
   forming a control gate on the gate insulating layer.

3. The method of claim 1, wherein the liner insulating layer comprises an oxide layer.

4. The method of claim 1, wherein the isolation layer comprises a Spin-on-Dielectric (SOD) layer.

5. The method of claim 4, wherein the SOD layer comprises a member selected from the group consisting of perhydropoly-silazane, hydro-silsesquioxane, and silicate.

6. The method of claim 4, further comprising performing a baking process and a thermal treatment process on the SOD layer after forming the SOD layer.

7. The method of claim 6, comprising performing the baking process at a temperature between approximately 50° C. and approximately 350° C., and performing the thermal treatment process at a temperature between approximately 300° C. and approximately 750° C. under an atmosphere selected from the group consisting of $H_2$, $O_2$, $H_2O$, $N_2$, and combinations thereof.

8. The method of claim 1, further comprising performing a planarization process to expose the surface of the pad nitride layer after the filling the trench to form the isolation layer; and removing the exposed pad nitride layer.

9. The method of claim 1, wherein respective top surfaces of the isolation layer and the liner insulating layer are higher than a bottom surface of the patterned floating gate after the first etching process.

10. The method of claim 1, comprising performing the first etching process using a dry etching method.

11. The method of claim 10, comprising performing the first etching process using the dry etching method is performed using a vapor gas mixed with HF and $NH_4F$ or plasma.

12. The method of claim 1, wherein the top surface of the isolation layer is lower than the surface of the semiconductor substrate after the second etching process by a thickness between approximately 400 Å and approximately 2000 Å.

13. The method of claim 1, further comprising performing the second etching process to allow wherein the top surface of the liner insulating layer to be disposed above the surface of the semiconductor substrate is higher than the top surface of the isolation layer after the second etching process.

14. The method of claim 1, comprising performing the second etching process by a wet etching method.

15. The method of claim 14, comprising performing the second etching process using the wet etching method using a HF solution diluted with $NH_4F$ or $H_2O$ as an etchant.

16. The method of claim 1, wherein the capping layer comprises an oxide layer.

17. The method of claim 1, wherein performing the third etching step comprises:
   performing a fourth etching process at an exposed surface of the first capping layer to provide the first capping layer with a concave shape, wherein the top surface of the first capping layer is parallel to the tunnel insulating layer, and the second capping layer contacts the floating gate on the surface of the liner insulating layer.

18. The method of claim 1, comprising performing the third etching process by a dry etching method.

19. The method of claim 17, comprising performing the forth etching process by a dry etching method using a vapor gas mixed with HF and $NH_4F$ or plasma, or a wet etching method using a HF solution diluted with $NH_4F$ or $H_2O$ as an etchant.

20. The method of claim 1, further comprising:
   forming a wall insulating layer in the trench before the forming the liner insulating layer.

* * * * *